(12) United States Patent
Yang et al.

(10) Patent No.: US 11,636,823 B2
(45) Date of Patent: *Apr. 25, 2023

(54) METHOD AND APPARATUS OF HANDLING SIGNAL TRANSMISSION APPLICABLE TO DISPLAY SYSTEM

(71) Applicant: NOVATEK Microelectronics Corp., Hsin-Chu (TW)

(72) Inventors: Shun-Hsun Yang, Hsinchu (TW); Tse-Hung Wu, New Taipei (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/669,393

(22) Filed: Feb. 11, 2022

(65) Prior Publication Data

US 2022/0165230 A1 May 26, 2022

Related U.S. Application Data

(63) Continuation of application No. 16/788,239, filed on Feb. 11, 2020, now Pat. No. 11,302,279, which is a continuation of application No. 15/614,583, filed on Jun. 5, 2017, now Pat. No. 10,593,285.

(60) Provisional application No. 62/477,452, filed on Mar. 28, 2017.

(51) Int. Cl.
| | |
|---|---|
| *G09G 5/00* | (2006.01) |
| *H03K 19/0185* | (2006.01) |
| *G06F 3/14* | (2006.01) |
| *H04L 25/02* | (2006.01) |
| *G09G 5/12* | (2006.01) |
| *H04L 25/14* | (2006.01) |
| *G09G 5/18* | (2006.01) |

(52) U.S. Cl.
CPC ............... *G09G 5/003* (2013.01); *G06F 3/14* (2013.01); *G09G 5/006* (2013.01); *G09G 5/12* (2013.01); *G09G 5/18* (2013.01); *H03K 19/018585* (2013.01); *H04L 25/0272* (2013.01); *H04L 25/14* (2013.01); *G09G 2310/08* (2013.01); *G09G 2370/08* (2013.01); *G09G 2370/14* (2013.01)

(58) Field of Classification Search
CPC .......... G09G 5/003; G09G 5/006; G09G 5/12; G09G 5/18; G09G 2310/08; G09G 2370/08; G09G 2370/14; G06F 3/14; H03K 19/018585; H04L 25/0272; H04L 25/14

See application file for complete search history.

(56) References Cited

U.S. PATENT DOCUMENTS

| | | |
|---|---|---|
| 6,590,559 B2 | 7/2003 | Takabayashi |
| 6,963,219 B1 | 11/2005 | Ghia |
| 9,257,079 B2 | 2/2016 | Zhao |

(Continued)

*Primary Examiner* — Grant Sitta
(74) *Attorney, Agent, or Firm* — Winston Hsu

(57) ABSTRACT

A method of handling signal transmission applicable to a display system includes a plurality of steps. The steps include transmitting a reset signal embedded in a first data signal to each of at least one source driver via a first data channel, generating a first control signal for setting the at least one source driver, and transmitting the first control signal embedded in a second data signal to each of the at least one source driver via a second data channel when the reset signal is transmitted via the first data channel.

12 Claims, 6 Drawing Sheets

(56) References Cited

U.S. PATENT DOCUMENTS

| | | |
|---|---|---|
| 9,582,679 B2 | 2/2017 | Ohtani |
| 10,593,285 B2 * | 3/2020 | Yang .......................... G06F 3/14 |
| 11,302,279 B2 * | 4/2022 | Yang ............. H03K 19/018585 |
| 2003/0048854 A1 | 3/2003 | Kaku |
| 2005/0168420 A1 | 8/2005 | Chung |
| 2008/0170063 A1 | 7/2008 | Ryu |
| 2008/0192030 A1 | 8/2008 | Yang |
| 2010/0131688 A1 | 5/2010 | Baek |
| 2010/0156885 A1 | 6/2010 | Cho |
| 2010/0164939 A1 | 7/2010 | So |
| 2011/0032421 A1 | 2/2011 | Kota |
| 2012/0098813 A1 | 4/2012 | Park |
| 2012/0154356 A1 | 6/2012 | Hsu |
| 2013/0002617 A1 | 1/2013 | Tsai |
| 2013/0050298 A1 | 2/2013 | Su |
| 2015/0350389 A1 | 12/2015 | Lee |
| 2017/0124949 A1 | 5/2017 | Lee |

* cited by examiner

METHOD AND APPARATUS OF HANDLING SIGNAL TRANSMISSION APPLICABLE TO DISPLAY SYSTEM

CROSS REFERENCE TO RELATED APPLICATIONS

This application is a continuation application of U.S. application Ser. No. 16/788,239, filed on Feb. 11, 2020, which is further a continuation application of U.S. application Ser. No. 15/614,583, filed on Jun. 5, 2017. U.S. application Ser. No. 15/614,583 further claims the benefit of U.S. Provisional Application No. 62/477,452, filed on Mar. 28, 2017. The contents of these applications are incorporated herein by reference.

BACKGROUND OF THE INVENTION

1. Field of the Invention

The present invention relates to a method and apparatus applicable to a display system, and more particularly, to a method and apparatus of handling signal transmission applicable to a display system.

2. Description of the Prior Art

A mini low voltage differential signaling (mini-LVDS) interface is a signal transmission interface widely applied in a display system, for connecting a timing controller and source driver (s) of the display system. In general, the timing controller communicates with each source driver of the display system via a plurality of mini-LVDS channels and other control channels such as transistor-transistor logic (TTL) interfaces. The mini-LVDS channels are used for transmitting display data, while the control signals for setting the source drivers are transmitted via the control channels. The great number of channels between the timing controller and each source driver require many connecting wires which occupy a large circuit area in the display system. A higher circuit cost of the display system is unavoidable due to the large circuit area.

SUMMARY OF THE INVENTION

It is therefore an objective of the disclosure to provide a method of handling signal transmission applicable to a display system, which allows reducing the number of channels between the timing controller and each source driver of the display system.

An embodiment of the present invention discloses a method of handling signal transmission applicable to a display system. The method comprises a plurality of steps. The steps include transmitting a reset signal embedded in a first data signal to each of at least one source driver via a first data channel; generating a first control signal for setting the at least one source driver; transmitting the first control signal embedded in a second data signal to each of the at least one source driver via a second data channel when the reset signal for setting each of the at least one source driver is transmitted via the first data channel; and transmitting display data to each of the at least one source driver via one or more data channels after the reset signal and the first control signal are transmitted.

Another embodiment of the present invention discloses a timing controller applicable to a display system. The timing controller comprises a first transmission circuit, a control signal generator, a second transmission circuit and a display data generator. The first transmission circuit is configured to transmit a reset signal embedded in a first data signal to each of at least one source driver via a first data channel. The control signal generator is configured to generate a first control signal for setting the at least one source driver. The second transmission circuit, coupled to the control signal generator, is configured to transmit the first control signal embedded in a second data signal to each of the at least one source driver via a second data channel when the first transmission circuit transmits the reset signal for setting each of the at least one source driver via the first data channel. The display data generator is configured to generate display data to be displayed in the display system. Wherein, the first transmission circuit and the second transmission circuit are further configured to transmit the display data to each of the at least one source driver via one or more data channels after the first transmission circuit transmits the reset signal and the second transmission circuit transmits the first control signal.

Another embodiment of the present invention discloses a source driver applicable to a display system. The source driver comprises a first receiving circuit, a second receiving circuit, a control signal receiver and a display data processor. The first receiving circuit is configured to receive a reset signal embedded in a first data signal from a timing controller via a first data channel. The second receiving circuit is configured to receive a first control signal embedded in a second data signal for setting the source driver from the timing controller via a second data channel when the first receiving circuit receives the reset signal for setting the source driver via the first data channel. The control signal receiver, coupled to the second receiving circuit, is configured to receive the first control signal from the second receiving circuit. The display data processor is configured to process display data to be displayed in the display system. Wherein, the first receiving circuit and the second receiving circuit are further configured to receive the display data from the timing controller via one or more data channels after the first receiving circuit receives the reset signal and the second receiving circuit receives the first control signal.

Another embodiment of the present invention discloses a method of handling signal transmission applicable to a display system. The method comprises a plurality of steps. The steps are transmitting a reset signal embedded in a first data signal to each of at least one source driver via a first data channel; generating a first control signal for setting the at least one source driver; transmitting the first control signal embedded in a second data signal to each of the at least one source driver via a second data channel when the reset signal for setting each of the at least one source driver is transmitted via the first data channel; and transmitting a second control signal to each of the at least one source driver via a third data channel when the reset signal is transmitted via the first data channel.

Another embodiment of the present invention discloses a timing controller applicable to a display system. The timing controller comprises a first transmission circuit, a control signal generator and a second transmission circuit. The first transmission circuit is configured to transmit a reset signal embedded in a first data signal to each of at least one source driver via a first data channel. The control signal generator is configured to generate a first control signal for setting the at least one source driver. The second transmission circuit, coupled to the control signal generator, is configured to transmit the first control signal embedded in a second data signal to each of the at least one source driver via a second data channel when the first transmission circuit transmits the reset signal for setting each of the at least one source driver via the first data channel, and configured to transmit a second control signal to each of the at least one source driver via a third data channel when the reset signal is transmitted via the first data channel.

Another embodiment of the present invention discloses a source driver applicable to a display system. The source driver comprises a first receiving circuit, a second receiving circuit and a control signal receiver. The first receiving circuit is configured to receive a reset signal embedded in a first data signal from a timing controller via a first data channel. The second receiving circuit is configured to receive a first control signal embedded in a second data signal for setting the source driver from the timing controller via a second data channel when the first receiving circuit receives the reset signal for setting the source driver via the first data channel, and configured to receive a second control signal from the timing controller via a third data channel when the reset signal is received via the first data channel. The control signal receiver, coupled to the second receiving circuit, is configured to receive the first control signal from the second receiving circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
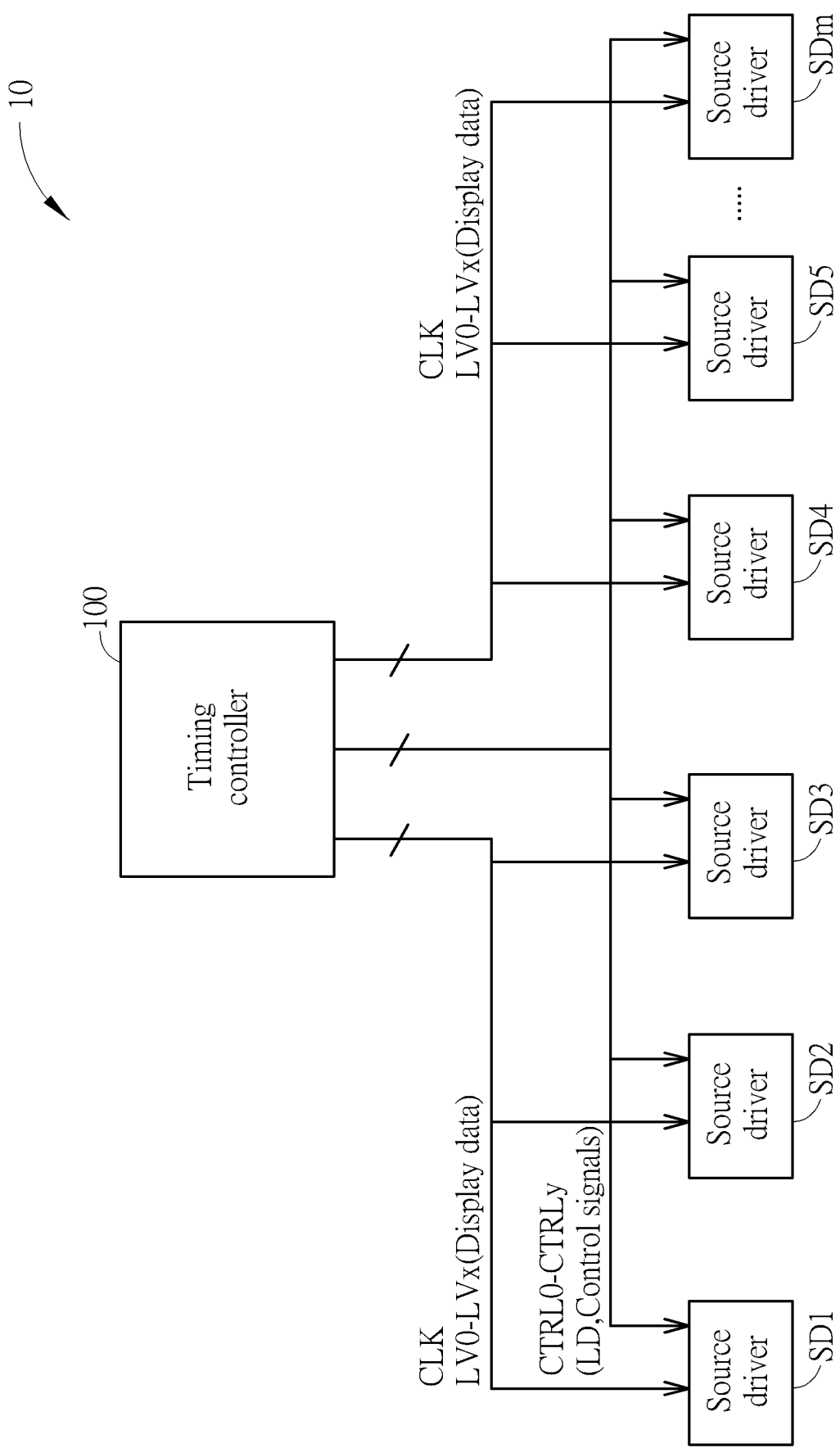
FIG. 1 is a schematic diagram of an example display system.

Please refer to FIG. 1, which is a schematic diagram of an example display system 10. The display system 10 includes a timing controller 100 and m source drivers SD1-SDm, wherein m is a positive integer. The source drivers SD1-SDm are used for outputting display data to a panel (not illustrated) of the display system 10. The timing controller 100 may generate the display data, transmit the display data to the source drivers SD1-SDm, and control the source drivers SD1-SDm to output the display data.

FIG. 1 further illustrates an exemplary implementation of connections between the timing controller 100 and the source drivers SD1-SDm. The timing controller 100 communicates with each of the source drivers SD1-SDm via a mini low voltage differential signaling (mini-LVDS) interface and a control interface. The mini-LVDS interface is used for transmitting the display data; that is, the timing controller 100 may transmit the display data to the source drivers SD1-SDm via the mini-LVDS interface. The mini-LVDS interface may include a plurality of mini-LVDS channels LV0-LVx and CLK. Among these mini-LVDS channels, at least one mini-LVDS channel CLK is a clock channel for transmitting the clock signal, and other mini-LVDS channels LV0-LVx are data channels for transmitting display data. The total number of mini-LVDS channels connected between the timing controller 100 and each source driver SD1-SDm depends on the quantity of display data to be transmitted, and should not be a limitation of the present invention. On the other hand, the control interface is used for transmitting control signals and a load data (LD) signal; that is, the timing controller 100 may transmit the control signals and the LD signal to the source drivers SD1-SDm via the control interface. The control signals are used for setting the parameters of the source drivers SD1-SDm. The LD signal is used for indicating the time interval for transmitting the display data to be displayed on each line of the panel. The control interface may include a plurality of control channels CTRL0-CTRLy, one of which may transmit the LD signal and the others may transmit different control signals.

Figure 2:
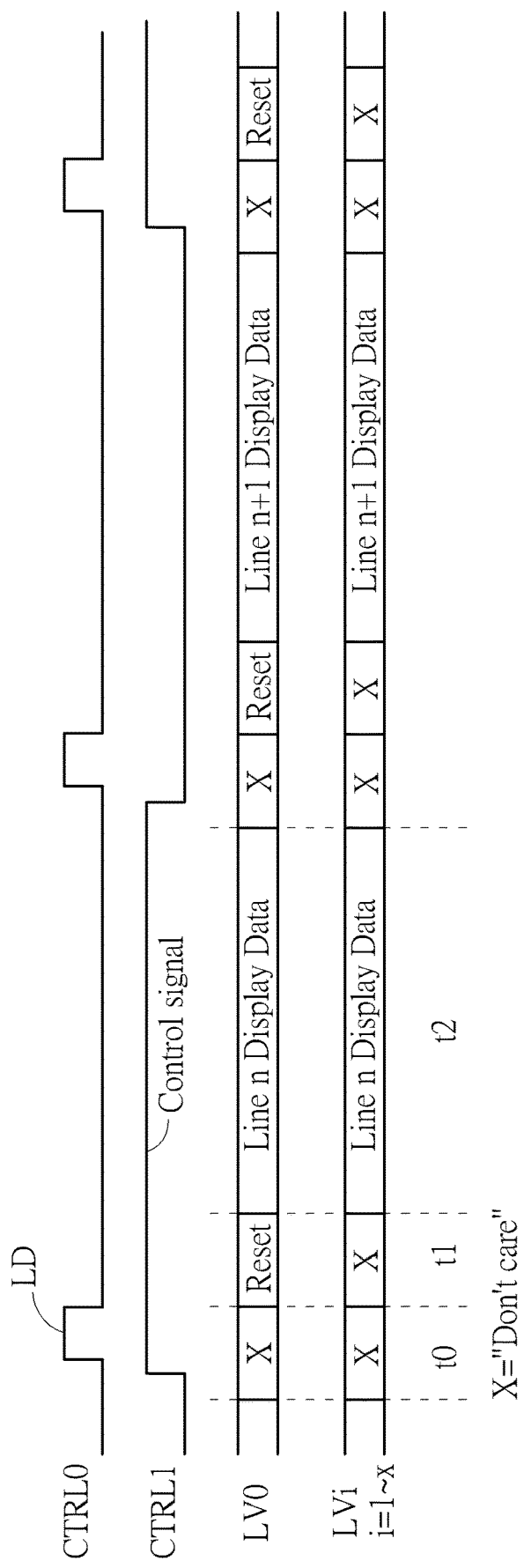
FIG. 2 is a waveform diagram of signal transmissions in the display system shown in FIG. 1.

Please refer to FIG. 2, which is a waveform diagram of signal transmissions in the display system 10. FIG. 2 illustrates waveforms of the control channels CTRL0 and CTRL1 and waveforms of the mini-LVDS channels LV0 and LVi, where i=1~x. As shown in FIG. 2, the control channel CTRL0 is used for transmitting the LD signal, which indicates the time interval for transmitting the display data to be displayed on each line of the panel. The control channel CTRL1 is used for transmitting a control signal. Note that the control channels CTRL1-CTRLy may transmit different control signals for different settings in the source drivers SD1-SDm, where the waveforms of the control channels CTRL2-CTRLy are omitted in FIG. 2 for simplicity.

The waveforms of the mini-LVDS channels LV0 and LVi are detailed as follows. In the time period t0, there is no data or signal transmitted. As for the mini-LVDS receivers in the source drivers SD1-SDm, the signal received in the time period t0 may be regarded as a "don't care" bit. In the time period t1, a reset signal is transmitted via the mini-LVDS channel LV0, while the mini-LVDS channels LV1-LVx still transmit "don't care" bits. In other words, there is still no data or signal transmitted via the mini-LVDS channels LV1-LVx in the time period t1. In the time period t2, the display data for line n of the panel is transmitted via the mini-LVDS channels LV0-LVx. The source drivers SD1-SDm may receive the display data by recognizing the reset signal on the mini-LVDS channel LV0; that is, the reset signal allows the source drivers SD1-SDm to determine the time of receiving the display data. More specifically, the reset signal may indicate a start of every line of the display data, so that the source drivers SD1-SDm are able to determine when to start receiving the display data according to the reset signal. Note that the transmissions of the reset signal and the display data are repeated for displaying the data for each line of the panel, as shown in FIG. 2.

Figure 3:
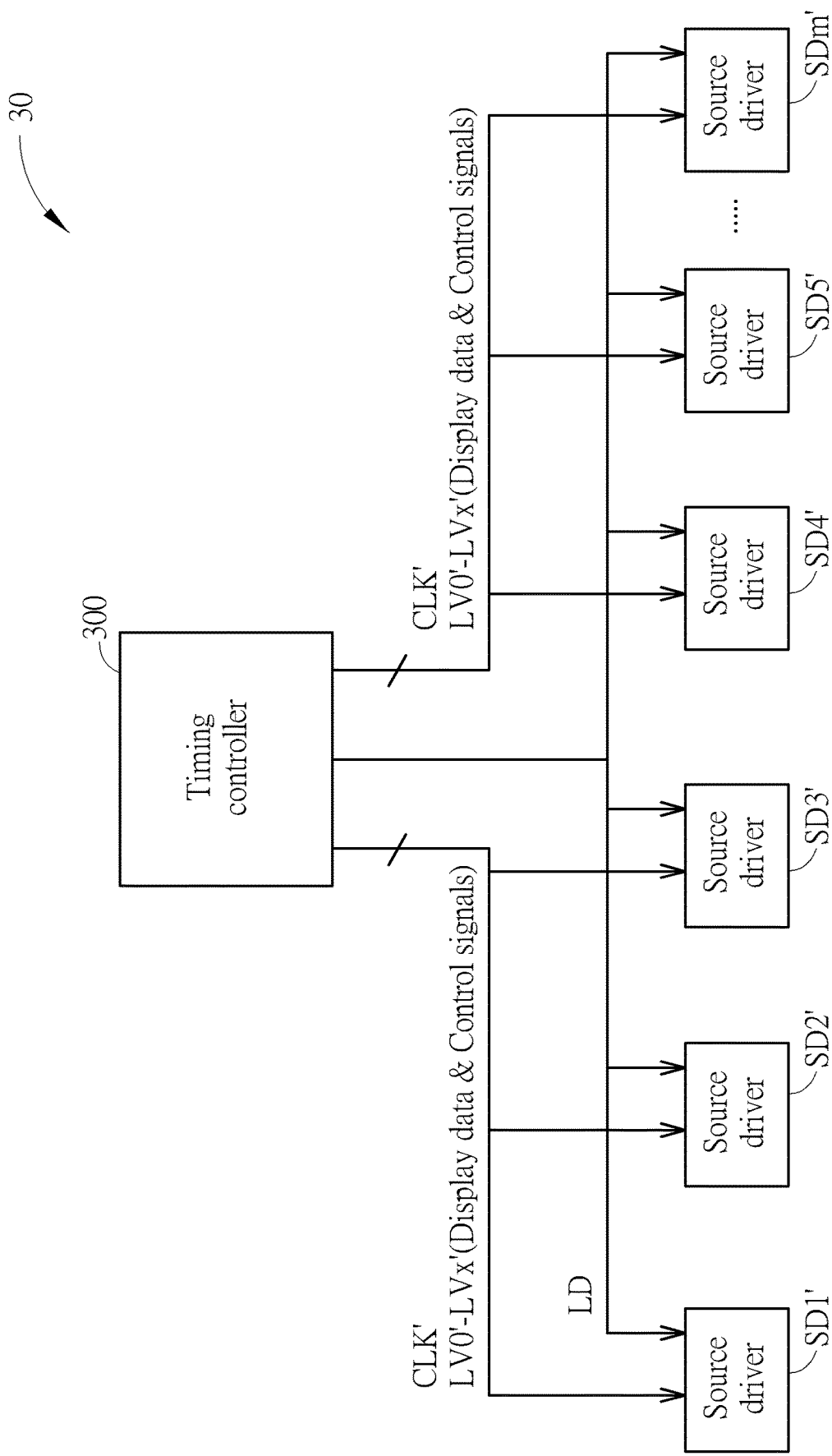
FIG. 3 is a schematic diagram of a display system according to an embodiment of the present invention.

Please refer to FIG. 3, which is a schematic diagram of a display system 30 according to an embodiment of the present invention. The display system 30 includes a timing controller 300 and m source drivers SD1'-SDm'. Each of the source drivers SD1'-SDm' may be an independent source driver chip, or may be a source driver circuit or module included in a semiconductor chip. The functions of the source drivers SD1'-SDm' and the timing controller 300 are similar to the functions of the source drivers SD1-SDm and the timing controller 100 as shown in FIG. 1, and will not be detailed herein.

Similarly, in the display system 30, the timing controller 300 communicates with each of the source drivers SD1'-SDm' via a mini-LVDS interface and a control interface. The mini-LVDS interface may include a plurality of mini-LVDS channels LV0'-LVx' and CLK'. Among these mini-LVDS channels, at least one mini-LVDS channel CLK' is a clock channel for transmitting the clock signal, and other mini-LVDS channels LV0'-LVx' are data channels for transmitting display data. Different from the display system 10 shown in FIG. 1, the control signals for setting the source drivers SD1'-SDm' are transmitted via the mini-LVDS channels LV0'-LVx'. The control interface of the display system 30 only includes one control channel for transmitting the LD signal. In such a situation, the timing controller 300 not only transmits the display data via the mini-LVDS channels LV0'-LVx', but also transmits the control signals via the mini-LVDS channels LV0'-LVx' serving as data channels.

Figure 4:
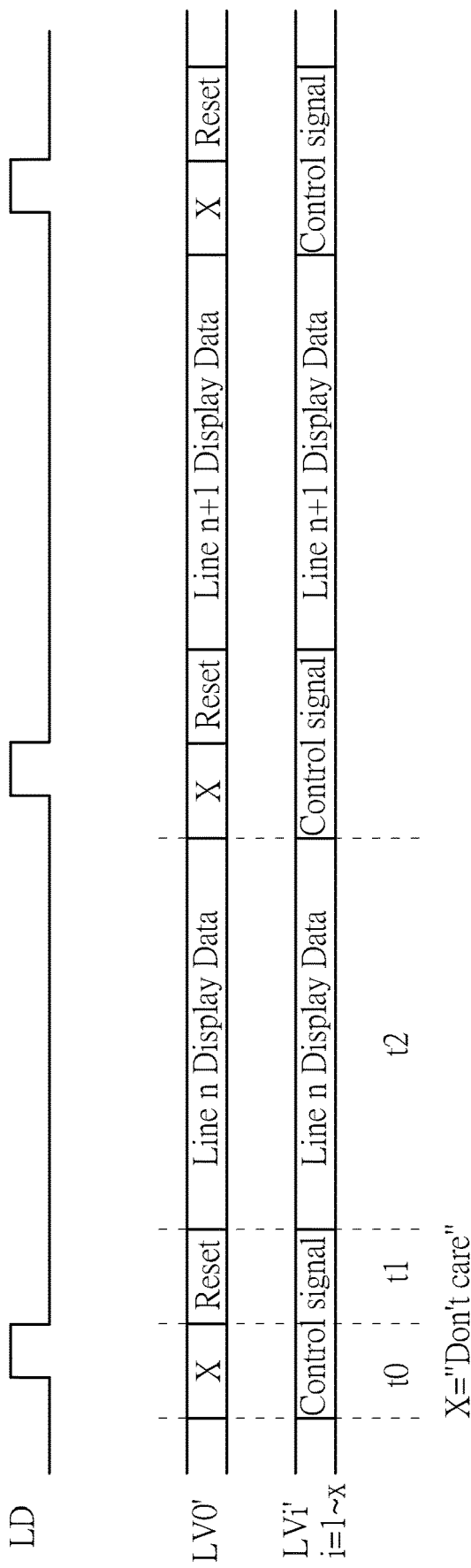
FIG. 4 is a waveform diagram of signal transmissions in the display system shown in FIG. 3.

In detail, please refer to FIG. 4, which is a waveform diagram of signal transmissions in the display system 30. As shown in FIG. 4, the control channel transmits the LD signal, which is used for indicating the time interval for transmitting the display data to be displayed on each line of the panel. Among the mini-LVDS channels LV0'-LVx', the mini-LVDS channel LV0' transmits the reset signal and the display data, as similar to the mini-LVDS channel LV0 shown in FIG. 2. The mini-LVDS channels LVi', where i=1~x, transmit the control signals in addition to the display data. The control signals are transmitted via the mini-LVDS channels LVi' when the reset signal is transmitted via the mini-LVDS channel LV0'. More specifically, when the timing controller 300 transmits the reset signal via the mini-LVDS channel LV0', the timing controller 300 may transmit the control signals via the mini-LVDS channels LV1'-LVx'. The source drivers SD1'-SDm' may receive the control signals via the mini-LVDS channels LV1'-LVx' and perform parameter settings accordingly.

In other words, the reset signal is embedded in a display data signal transmitted on the data channel LV0', while the control signals are embedded in other display data signals transmitted on one or more of other data channels LV1'-LVx'.

Please note that the length of the control signals transmitted via the mini-LVDS channels LV1'-LVx' may occupy any "don't care" bits as in the time periods t0 and t1 in the mini-LVDS channels LVi-LVx shown in FIG. 2. If the "don't care" bits are entirely occupied by the control signals, the length of the control signals transmitted via the mini-LVDS channel LVi' may be longer than the length of the reset signal transmitted via the mini-LVDS channel LV0'. In another embodiment, the length of the control signals transmitted via the mini-LVDS channel LVi' may be equal to or shorter than the length of the reset signal transmitted via the mini-LVDS channel LV0'. If the length of a control signal is N, the data amount carried by the control signal may be up to $2^N$. In addition, the lengths of the control signals transmitted via the mini-LVDS channels LVi', LV2' ... and LVx' may be the same as or different from each other. As long as the control signals are transmitted via the mini-LVDS interface, the signal transmission method should be within the scope of the present invention.

In other words, if the reset signal is transmitted to the source drivers SD1'-LV0' via the mini-LVDS channel LV0' during a first period and a control signal is transmitted to the source drivers SD1'-SDm' via any of the mini-LVDS channels LV1'-LVx' during a second period, the second period may be exactly or partially overlapped with the first period. The second period and the first period may be overlapped in any manner. For example, the second period may be longer than, equal to, or shorter than the first period. In an embodiment, the starting point of the second period is equal to the starting point of the first period; that is, transmissions of the reset signal and the control signal start at the same time. In another embodiment, the control signal may be transmitted before transmission of the reset signal starts, and when the reset signal starts to be transmitted, transmission of the control signal does not finish yet; hence, the transmissions of the reset signal and the control signal are thereby overlapped. Alternatively, the control signal may start to be transmitted after transmission of the reset signal starts, and when the control signal starts to be transmitted, transmission of the reset signal does not finish yet; hence, the transmissions of the reset signal and the control signal are thereby overlapped.

As mentioned above, the control signals may occupy any "don't care" bits of the mini-LVDS channels and may have any length. In order to allow the source drivers SD1'-SDm' to recognize the control signal and determine when to receive the control signal, a header is transmitted prior to the control signal via the mini-LVDS channel LVi', where the header may have a predetermined pattern. The predetermined pattern, which are known by the source drivers SD1'-SDm' in advance, may be, for example, a predetermined format, length, bit number, content, or any combination of these parameters. After any one of the source drivers SD1'-SDm' receives the header, this source driver may start to receive the control signal. Also, in order to allow the source drivers SD1'-SDm' to determine when to stop receiving the control signal, a footer is transmitted next to the control signal via the mini-LVDS channel LVi', where the footer may have a predetermined pattern. The predetermined pattern of the footer are also known by the source drivers SD1'-SDm' in advance, and may be, for example, a predetermined format, length, bit number, content, or any combination of these parameters. After any one of the source drivers SD1'-SDm' receives the footer, this source driver may stop receiving the control signal.

The control signals transmitted via the mini-LVDS channel LVi' may control the source drivers SD1'-SDm' to perform parameter settings. The parameter setting may include any settings of one or more of operating parameters in the source drivers SD1'-SDm'. The operating parameters may include an operating parameter for adjusting the driving capability of the source drivers SD1'-SDm', an operating parameter for adjusting the operating speed of the source drivers SD1'-SDm', an operating parameter for adjusting the power of the source drivers SD1'-SDm', and/or an operating parameter for adjusting the operation of the source drivers SD1'-SDm'. For example, if the display system 30 is operated in a power saving mode or low power mode, the source drivers SD1'-SDm' should output display data having lower brightness and/or the source drivers SD1'-SDm' should perform other power saving operations. These operations are controlled by the timing controller 300 and instructed via the control signals. In an embodiment, the timing controller 300 may control the resolution of image by controlling the source drivers SD1'-SDm' to output a specific level of display data, and the related control is realized by the control signals. In order to realize a preferable image quality, the source drivers SD1'-SDm' may perform image processing techniques such as charge sharing and/or polarity inversion. The timing controller 300 may control the source drivers SD1'-SDm' to perform the image processing techniques via the control signals. Note that the control signals may indicate the settings of any possible operating parameter for any of the source drivers SD1'-SDm'.

Please note that a control signal for a parameter setting may be included in any one of the mini-LVDS channels LV1'-LVx'; that is, the control signal transmitted via the mini-LVDS channel LVi' may control the source drivers SD1'-SDm' to perform the parameter setting. In another embodiment, the control signal transmitted via the mini-LVDS channel LVi' may be incorporated with another control signal transmitted via another mini-LVDS channel among the mini-LVDS channels LV1'-LVx', e.g., the mini-LVDS channel LV(i+1)', to control the source drivers SD1'-SDm' to perform the parameter setting. In other words, a control signal for an operating parameter may be carried on one of the mini-LVDS channels LV1'-LVx', or may be separated and then carried on multiple of the mini-LVDS channels LV1'-LVx'.

If a first control signal is transmitted via the mini-LVDS channel LVi' and a second control signal is transmitted via the mini-LVDS channel LV(i+1)', each of the first and second control signals may control the source drivers SD1'-SDm' to perform a respective setting for the operating parameters. The content of the first control signal and the content of the second control signal may be identical or different. In an embodiment, the first control signal and the second control signal may be incorporated to perform a specific setting operation. In another embodiment, the first control signal and the second control signal may be configured to different setting operations. For example, the first control signal is configured to adjust the driving capability, while the second control signal is configured to adjust power setting.

According to embodiments of the present invention, the number of control channels of the control interface may be reduced, where there may be only one control channel between the timing controller and the source drivers, for transmitting the LD signal. In such a situation, the control signals are transmitted via the mini-LVDS channels. Since the control signals are carried on the original "don't care" bits, no additional mini-LVDS channels are required. In such a situation, the circuit area and cost of the display system may be reduced due to the reduction of control channels.

Figure 5:
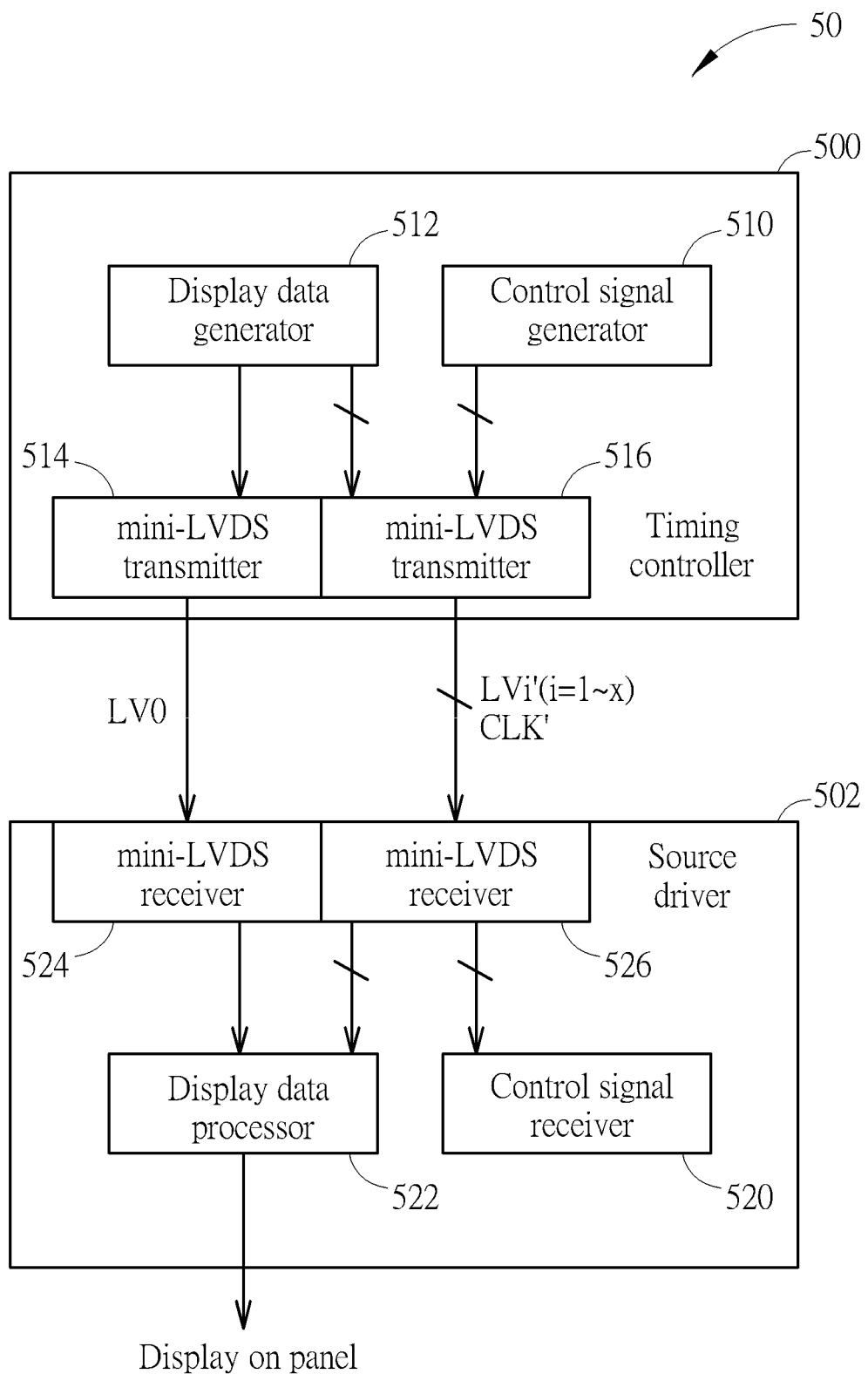
FIG. 5 is a schematic diagram of a display system according to an embodiment of the present invention.

Please refer to FIG. 5, which is a schematic diagram of a display system 50 according to an embodiment of the present invention. The display system 50 includes a timing controller 500 and a source driver 502. FIG. 5 illustrates an exemplary detailed structure of the timing controller 500 and the source driver 502. Note that there may be a plurality of source drivers included in the display system 50 having similar structures, and only one source driver 502 is illustrated in FIG. 5 for simplicity.

As shown in FIG. 5, the timing controller 500 includes a control signal generator 510, a display data generator 512 and mini-LVDS transmitters 514 and 516. The control signal generator 510 is used for generating control signals for setting the source driver 502. The display data generator 512 is used for generating display data to be displayed on a panel (not illustrated) of the display system 50. The source driver 502 includes a control signal receiver 520, a display data processor 522 and mini-LVDS receivers 524 and 526. The control signal receiver 520 is used for receiving the control signal from the mini-LVDS receiver 526, where the control signal is generated by the control signal generator 510 and then transmitted via the mini-LVDS channel(s). The display data processor 522 is used for processing display data to be displayed on the panel of the display system according to the parameter settings of the source driver 502.

The mini-LVDS transmitter 514 of the timing controller 500 is electrically connected to the mini-LVDS receiver 524 of the source driver 502 via a mini-LVDS channel such as the mini-LVDS channel LV0' as shown in FIGS. 3 and 4. The mini-LVDS transmitter 516 of the timing controller 500 is electrically connected to the mini-LVDS receiver 526 of the source driver 502 via at least one mini-LVDS channel such as the data channels LVi' (i=1~x) and the clock channel CLK' as shown in FIGS. 3 and 4. The mini-LVDS transmitter 516 may be regarded as a plurality of transmitters and the mini-LVDS receiver 526 may be regarded as a plurality of receivers, and each of the plurality of transmitters and a corresponding receiver communicate with each other via a mini-LVDS channel. In this embodiment, the mini-LVDS transmitter 514 of the timing controller 500 may transmit the reset signal to the mini-LVDS receiver 524 of the source driver 502 via the mini-LVDS channel LV0', and transmit the display data to the mini-LVDS receiver 524 via the mini-LVDS channel LV0' after transmitting the reset signal. The mini-LVDS transmitter 516 of the timing controller 500 may transmit the control signal to the mini-LVDS receiver 526 of the source driver 502 via the mini-LVDS channel LVi' when the mini-LVDS transmitter 514 transmits the reset signal via the mini-LVDS channel LV0'. The mini-LVDS transmitter 516 then transmits the display data to the mini-LVDS receiver 526 via the mini-LVDS channel LVi' after transmitting the control signal. At the source driver 502 side, the mini-LVDS receiver 524 may receive the reset signal from the mini-LVDS transmitter 514 of the timing controller 500 via the mini-LVDS channel LV0', and receive the display data from the mini-LVDS transmitter 514 via the mini-LVDS channel LV0' after receiving the reset signal. The mini-LVDS receiver 526 may receive the control signal from the mini-LVDS transmitter 516 of the timing controller 500 via the mini-LVDS channel LVi' when the mini-LVDS receiver 524 receives the reset signal via the mini-LVDS channel LV0'. The mini-LVDS receiver 526 then receives the display data from the mini-LVDS transmitter 516 via the mini-LVDS channel LVi' after receiving the control signal. In addition, the mini-LVDS transmitter 516 may further transmit a clock signal to the mini-LVDS receiver 526 via the clock channel CLK' among the mini-LVDS channels.

In another embodiment, a source driver may be compatible with a conventional timing controller. That is, in a source driver capable of receiving control signals via the mini-LVDS channels and the control channels, the control signal receiver may be coupled to both of a mini-LVDS receiver and a control channel receiver. If the corresponding timing controller is able to transmit control signals via the mini-LVDS channels, the source driver may receive the control signals via the mini-LVDS channels and the control channels may be omitted to save circuit area and costs. If the corresponding timing controller is a conventional timing controller that transmits control signals via the control channels, e.g., via a transistor-transistor logic (TTL) interface, the source driver may receive the control signals via the control channels. In a similar manner, the timing controller may also be compatible with a conventional source driver.

Please note that the embodiments aim at providing a signal transmission method used in a display system, where the control signals for setting the source driver(s) are transmitted via the mini-LVDS interface. Those skilled in the art may make modifications and alternations accordingly. For example, the structure of the timing controller and the source driver shown in FIG. 5 is only one of various implementations of the present invention. The wire connections between the timing controller and the source drivers shown in FIG. 3 are only one of various implementations of the present invention. For example, in an embodiment, the timing controller may be electrically connected to each source driver via respective connecting wires, i.e., every source driver has a dedicated mini-LVDS interface connected to the timing controller. In the embodiments of the present invention, there may be any number of source drivers connected to the timing controller. For each source driver, there may be any number of mini-LVDS channels connected between the source driver and the timing controller, where one of the mini-LVDS channels is used for transmitting the reset signal, and other mini-LVDS channels are used for transmitting the control signal when the reset signal is transmitted.

Figure 6:
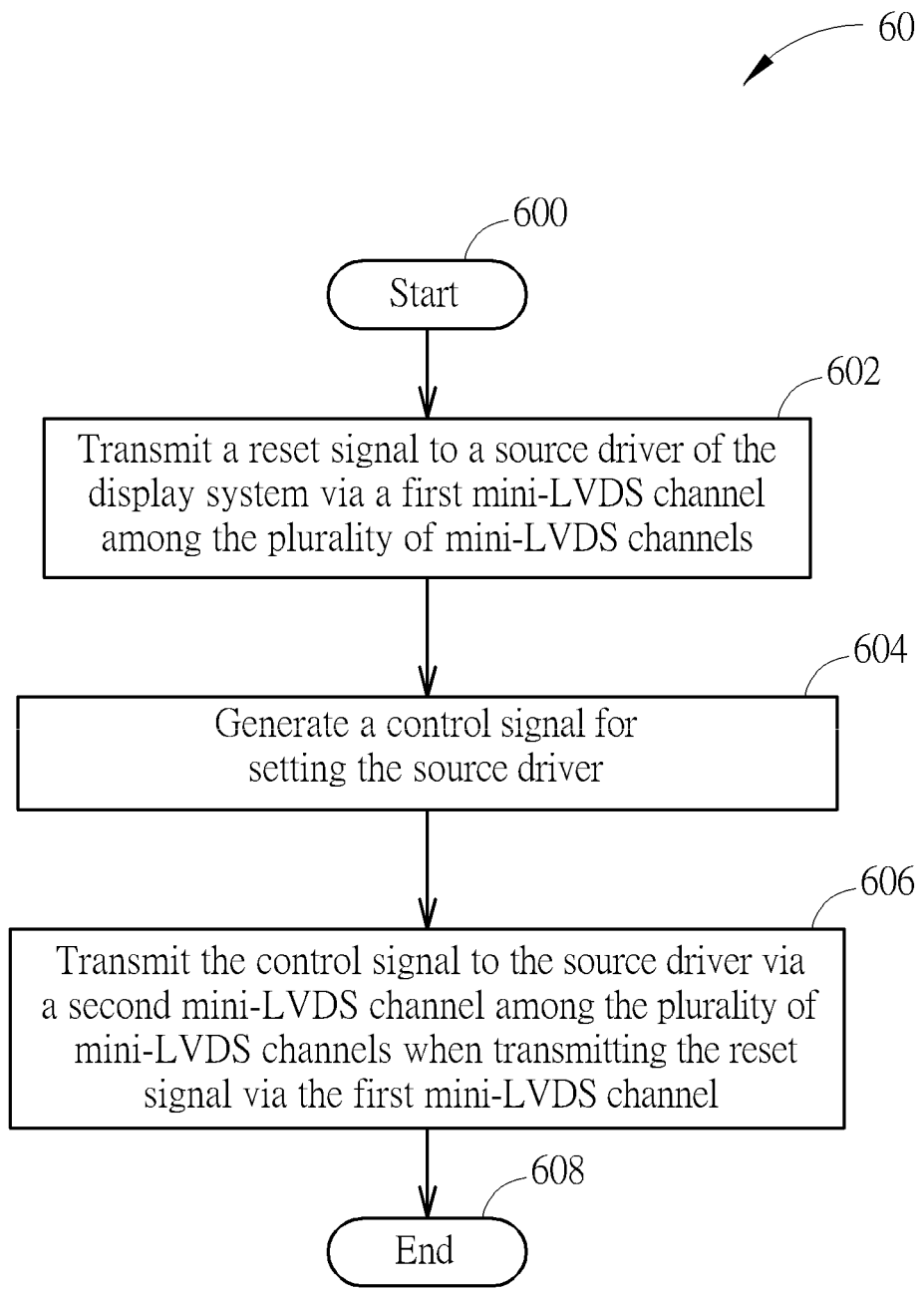
FIG. 6 is a flow chart of a signal transmission process according to an embodiment of the present invention.

The abovementioned operations of the signal transmission method used for the display system may be summarized into a signal transmission process 60, as shown in FIG. 6. The signal transmission process 60 may be used in a timing controller of the display system such as the timing controller 500 shown in FIG. 5 but not limited thereto, where the timing controller is electrically connected to at least one source driver of the display system via a plurality of mini-LVDS channels. The signal transmission process 60 includes the following steps:

Step 600: Start.

Step 602: Transmit a reset signal to each of the at least one source driver of the display system via a first mini-LVDS channel among the plurality of mini-LVDS channels.

Step 604: Generate a control signal for setting the at least one source driver.

Step 606: Transmit the control signal to each of the at least one source driver via a second mini-LVDS channel among the plurality of mini-LVDS channels when the reset signal is transmitted via the first mini-LVDS channel.

Step 608: End.

To sum up, the embodiments of the disclosure provide a method of handling signal transmission in a display system. In the display system, the timing controller communicates with the source driver(s) via a mini-LVDS interface including a plurality of mini-LVDS channels. The timing controller transmits display data to the source driver(s) via the plurality of mini-LVDS channels. Moreover, in order to allow the source driver(s) to know when to receive the display data, the timing controller may transmit a reset signal to the source driver (s) via one of the plurality of mini-LVDS channels prior to transmission of the display data. Furthermore, when this mini-LVDS channel is used for transmitting the reset signal, the timing controller may transmit control signals for setting the source driver(s) to the source driver(s) via other mini-LVDS channels. In such a situation, other control channels for the control signals may be omitted, which saves circuit area and costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of handling signal transmission applicable to a display system, the method comprising:
   transmitting a reset signal embedded in a first data signal to each of at least one source driver via a first data channel;
   generating a first control signal for setting the at least one source driver;
   transmitting the first control signal embedded in a second data signal to each of the at least one source driver via a second data channel when the reset signal for setting each of the at least one source driver is transmitted via the first data channel; and
   transmitting display data to each of the at least one source driver via one or more data channels after the reset signal and the first control signal are transmitted.

2. The method of claim 1, further comprising configuring each of the at least one source driver to use the reset signal to determine a time of receiving the display data.

3. A timing controller applicable to a display system, comprising:
   a first transmission circuit, configured to transmit a reset signal embedded in a first data signal to each of at least one source driver via a first data channel;
   a control signal generator, configured to generate a first control signal for setting the at least one source driver;
   a second transmission circuit, coupled to the control signal generator, and configured to transmit the first control signal embedded in a second data signal to each of the at least one source driver via a second data channel when the first transmission circuit transmits the reset signal for setting each of the at least one source driver via the first data channel; and
   a display data generator, for generating display data to be displayed in the display system;
   wherein the first transmission circuit and the second transmission circuit are further configured to transmit the display data to each of the at least one source driver via one or more data channels after the first transmission circuit transmits the reset signal and the second transmission circuit transmits the first control signal.

4. The timing controller of claim 3, wherein the reset signal is used by each of the at least one source driver to determine a time of receiving the display data.

5. A source driver applicable to a display system, comprising:
   a first receiving circuit, configured to receive a reset signal embedded in a first data signal from a timing controller via a first data channel;
   a second receiving circuit, configured to receive a first control signal embedded in a second data signal for setting the source driver from the timing controller via a second data channel when the first receiving circuit receives the reset signal for setting the source driver via the first data channel;
   a control signal receiver, coupled to the second receiving circuit, and configured to receive the first control signal from the second receiving circuit; and
   a display data processor, for processing display data to be displayed in the display system;
   wherein the first receiving circuit and the second receiving circuit are further configured to receive the display data from the timing controller via one or more data channels after the first receiving circuit receives the reset signal and the second receiving circuit receives the first control signal.

6. The source driver of claim 5, wherein the reset signal is used by the source driver to determine a time of receiving the display data.

7. A method of handling signal transmission applicable to a display system, the method comprising:
   transmitting a reset signal embedded in a first data signal to each of at least one source driver via a first data channel;
   generating a first control signal for setting the at least one source driver;
   transmitting the first control signal embedded in a second data signal to each of the at least one source driver via a second data channel when the reset signal for setting each of the at least one source driver is transmitted via the first data channel; and transmitting a second control signal to each of the at least one source driver via a third data channel when the reset signal is transmitted via the first data channel.

8. The method of claim 7, further comprising using each of the first control signal and the second control signal to control each of the at least one source driver to perform a respective parameter setting for one or more operating parameters.

9. A timing controller applicable to a display system, comprising:

a first transmission circuit, configured to transmit a reset signal embedded in a first data signal to each of at least one source driver via a first data channel;

a control signal generator, configured to generate a first control signal for setting the at least one source driver; and a second transmission circuit, coupled to the control signal generator, configured to transmit the first control signal embedded in a second data signal to each of the at least one source driver via a second data channel when the first transmission circuit transmits the reset signal for setting each of the at least one source driver via the first data channel, and configured to transmit a second control signal to each of the at least one source driver via a third data channel when the reset signal is transmitted via the first data channel.

10. The timing controller of claim 9, wherein each of the first control signal and the second control signal controls each of the at least one source driver to perform a respective parameter setting for one or more operating parameters.

11. A source driver applicable to a display system, comprising:

a first receiving circuit, configured to receive a reset signal embedded in a first data signal from a timing controller via a first data channel;

a second receiving circuit, configured to receive a first control signal embedded in a second data signal for setting the source driver from the timing controller via a second data channel when the first receiving circuit receives the reset signal for setting the source driver via the first data channel, and configured to receive a second control signal from the timing controller via a third data channel when the reset signal is received via the first data channel; and a control signal receiver, coupled to the second receiving circuit, and configured to receive the first control signal from the second receiving circuit.

12. The source driver of claim 11, wherein each of the first control signal and the second control signal controls the source driver to perform a respective parameter setting for one or more operating parameters.

* * * * *